(12) United States Patent
Mimotogi

(10) Patent No.: US 8,081,294 B2
(45) Date of Patent: Dec. 20, 2011

(54) METHOD OF EVALUATING OPTICAL BEAM SOURCE OF EXPOSURE DEVICE, METHOD OF DESIGNING ILLUMINATION SHAPE OF EXPOSURE DEVICE, AND SOFTWARE FOR OPTIMIZING ILLUMINATION SHAPE OF EXPOSURE DEVICE

(75) Inventor: Akiko Mimotogi, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 570 days.

(21) Appl. No.: 12/101,468

(22) Filed: Apr. 11, 2008

(65) Prior Publication Data

US 2008/0252872 A1 Oct. 16, 2008

(30) Foreign Application Priority Data

Apr. 13, 2007 (JP) ................. 2007-106394

(51) Int. Cl.
 *G01J 1/32* (2006.01)
 *G03B 27/32* (2006.01)
 *G03B 27/42* (2006.01)
 *G03B 27/54* (2006.01)
 *G03B 27/74* (2006.01)
 *G03C 5/00* (2006.01)

(52) U.S. Cl. .............. 355/68; 250/205; 355/53; 355/67; 355/77; 430/30

(58) Field of Classification Search ............... 250/201.1, 250/492.2, 492.22, 548, 205, 372, 393, 395; 355/53, 67–71, 77; 430/5, 30, 311; 716/19–21; 356/12, 51, 213, 215, 217–218, 228; 382/141, 382/312, 324
See application file for complete search history.

(56) References Cited

U.S. PATENT DOCUMENTS

| | | | |
|---|---|---|---|
| 5,680,588 A * | 10/1997 | Gortych et al. | 430/30 |
| 7,030,966 B2 | 4/2006 | Hansen | |
| 7,180,576 B2 | 2/2007 | Hansen | |
| 2003/0236653 A1* | 12/2003 | Zinn | 703/6 |
| 2004/0156030 A1* | 8/2004 | Hansen | 355/67 |
| 2006/0107249 A1* | 5/2006 | Zhang et al. | 716/21 |
| 2006/0114440 A1* | 6/2006 | Sekigawa et al. | 355/69 |
| 2008/0158529 A1* | 7/2008 | Hansen | 355/53 |
| 2009/0262324 A1* | 10/2009 | Patra et al. | 355/68 |

FOREIGN PATENT DOCUMENTS

| | | |
|---|---|---|
| JP | 2006-66440 | 3/2006 |
| JP | 2007-80947 | 3/2007 |
| WO | WO 2008061681 A2 * | 5/2008 |

* cited by examiner

*Primary Examiner* — Hung Henry Nguyen
*Assistant Examiner* — Colin Kreutzer
(74) *Attorney, Agent, or Firm* — Finnegan, Henderson, Farabow, Garrett & Dunner, LLP

(57) ABSTRACT

A method of evaluating an exposure optical beam source of an exposure device used in an exposure process in manufacturing a semiconductor device is disclosed, in which the method includes dividing an exposure optical beam source into a plurality of unit optical beam sources in a unit size determined by an exposure device, acquiring a difference between an evaluation amount of a target pattern on a semiconductor substrate when a unit optical beam source is turned on and an evaluation amount of the target pattern on the semiconductor substrate when the unit optical beam source is turned off, and evaluating the exposure optical beam source by using the acquired difference as an index.

19 Claims, 9 Drawing Sheets

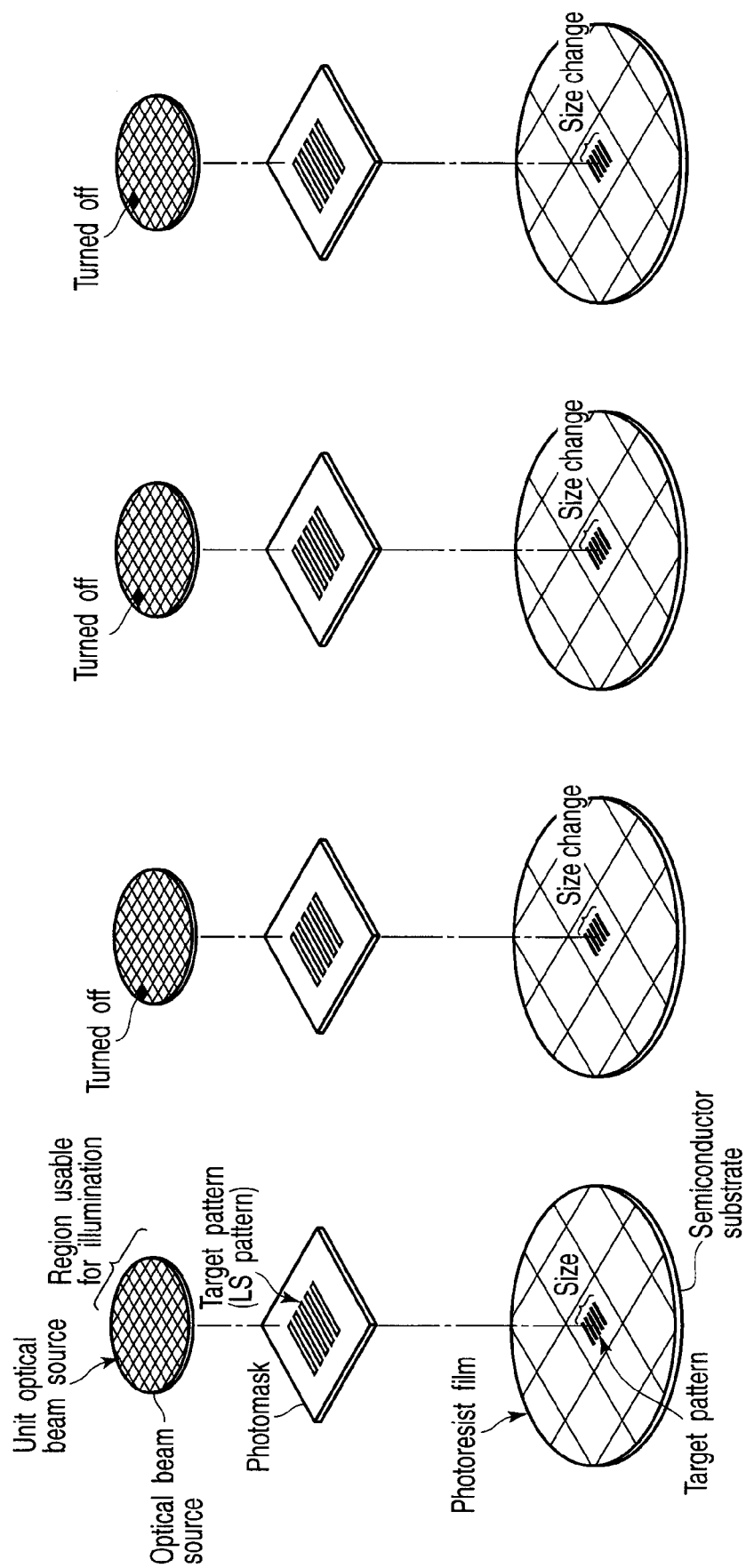

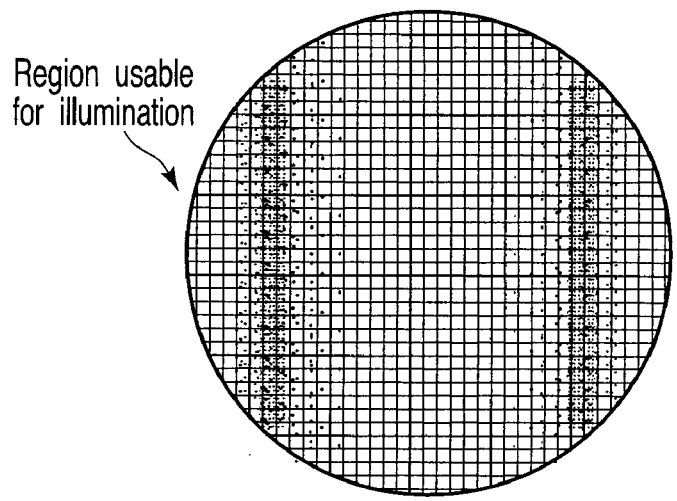
F I G. 5
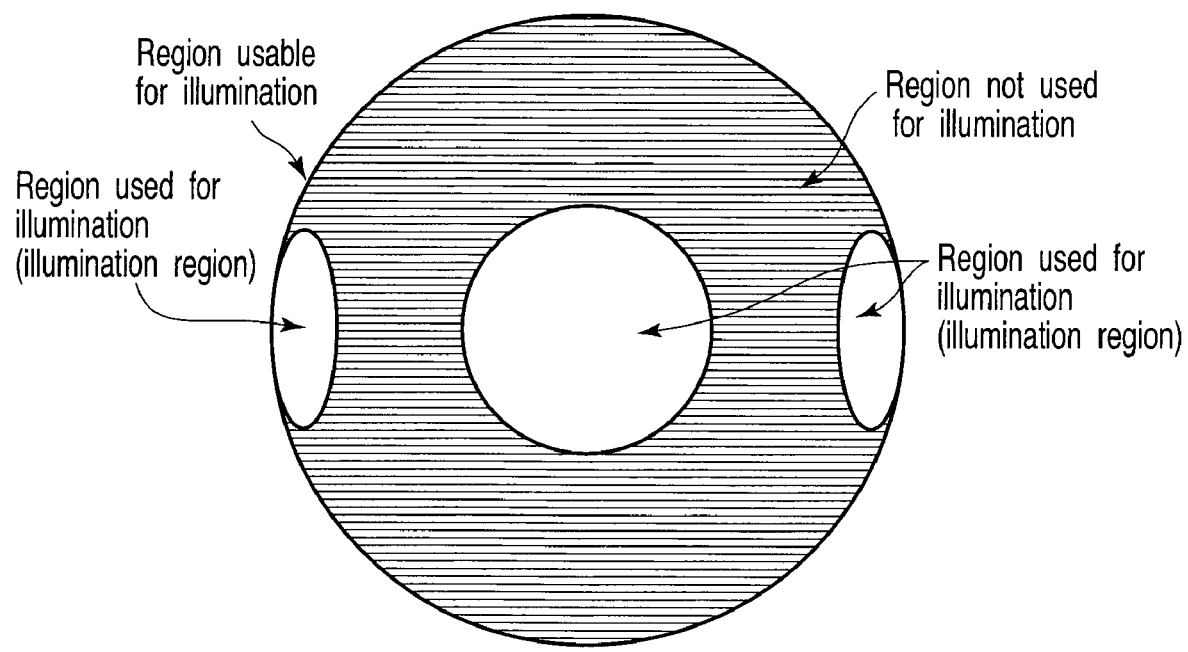
F I G. 6

METHOD OF EVALUATING OPTICAL BEAM SOURCE OF EXPOSURE DEVICE, METHOD OF DESIGNING ILLUMINATION SHAPE OF EXPOSURE DEVICE, AND SOFTWARE FOR OPTIMIZING ILLUMINATION SHAPE OF EXPOSURE DEVICE

CROSS-REFERENCE TO RELATED APPLICATIONS

This application is based upon and claims the benefit of priority from prior Japanese Patent Application No. 2007-106394, filed Apr. 13, 2007, the entire contents of which are incorporated herein by reference.

BACKGROUND OF THE INVENTION

1. Field of the Invention

The present invention relates to a method of evaluating an optical beam source of an exposure device, a method of designing illumination shape of an exposure device, and a software for optimizing illumination shape of an exposure device, and is particularly used in an exposure process in manufacturing a semiconductor device and the like.

2. Description of the Related Art

In an exposure process in manufacturing a semiconductor device and the like, an illumination shape for forming a desired resist pattern is designed by using photomasks having a plurality of different patterns (for example, line-and-space pattern, isolated line pattern, hole pattern). In the designing, the exposure optical beam source is divided into small grids to form a plurality of unit optical beam sources (or spot optical beam sources). In this case, an evaluation of the unit optical beam sources is made by using, as an index, an intensity of an image formed by each of the unit optical beam sources, a contrast of the image, NILS (normalized image log-slope), or the like.

However, satisfactory measures are not taken into consideration by these indices alone, if the optical beam source is not formed exactly as designed, for example, if there is an error in an illumination aperture.

BRIEF SUMMARY OF THE INVENTION

According to a first aspect of the present invention, there is provided a method of evaluating an exposure optical beam source of an exposure device used in an exposure process in manufacturing a semiconductor device, the method comprising:

dividing an exposure optical beam source into a plurality of unit optical beam sources in a unit size determined by an exposure device;

acquiring a difference between an evaluation amount of a target pattern on a semiconductor substrate when a unit optical beam source is turned on and an evaluation amount of the target pattern on the semiconductor substrate when the unit optical beam source is turned off; and evaluating the exposure optical beam source by using the acquired difference as an index.

According to a second aspect of the present invention, there is provided a method of designing an illumination shape of an exposure device used in an exposure process in manufacturing a semiconductor device, the method comprising:

dividing an exposure optical beam source into a plurality of unit optical beam sources in a unit size determined by the exposure device;

acquiring, for each of the unit optical beam sources in an entire region usable for illumination, a difference between an evaluation amount of a target pattern on a semiconductor substrate when a unit optical beam source is turned on and an evaluation amount of the target pattern on the semiconductor substrate when the unit optical beam source is turned off;

plotting the difference acquired for each of the unit optical beam sources on a position corresponding to said each unit optical beam source on the optical beam source region usable for illumination to form a difference map; and selecting a portion of the optical beam source region in which the differences acquired for the unit optical beam sources are within an allowable value is selected by referring to the difference map to form an illumination shape of the exposure device corresponding to the selected portion.

According to a third aspect of the present invention, there is provided a software for optimizing illumination shape of an exposure device used in an exposure process in manufacturing a semiconductor device and provided with a computer-readable recording medium:

a procedure of dividing an exposure optical beam source into a plurality of unit optical beam sources in a unit size determined by the exposure device;

a procedure of acquiring, for each of the unit optical beam sources in an entire region usable for illumination, a difference between an evaluation amount of a target pattern on a semiconductor substrate when a unit optical beam source is turned on, and an evaluation amount of the target pattern on the semiconductor substrate when the unit optical beam source is turned off;

a procedure of plotting the difference acquired for each of the unit optical beam sources on a position corresponding to said each unit optical beam source on the optical beam source region usable for illumination to form a difference map; and a procedure of selecting a portion of the optical beam source region in which the differences acquired for the unit optical beam sources are within an allowable value is selected by referring to the difference map to form an illumination shape of the exposure device corresponding to the selected portion.

BRIEF DESCRIPTION OF THE SEVERAL VIEWS OF THE DRAWING

FIGS. 4A, 4B, 4C, and 4D are diagrams each schematically showing a state of acquiring a difference;

FIG. 5 is a diagram showing an example of a difference map;

FIG. 6 is a diagram showing an example of illumination shape designed according to the first embodiment of the present invention;

DETAILED DESCRIPTION OF THE INVENTION

Figure 1:
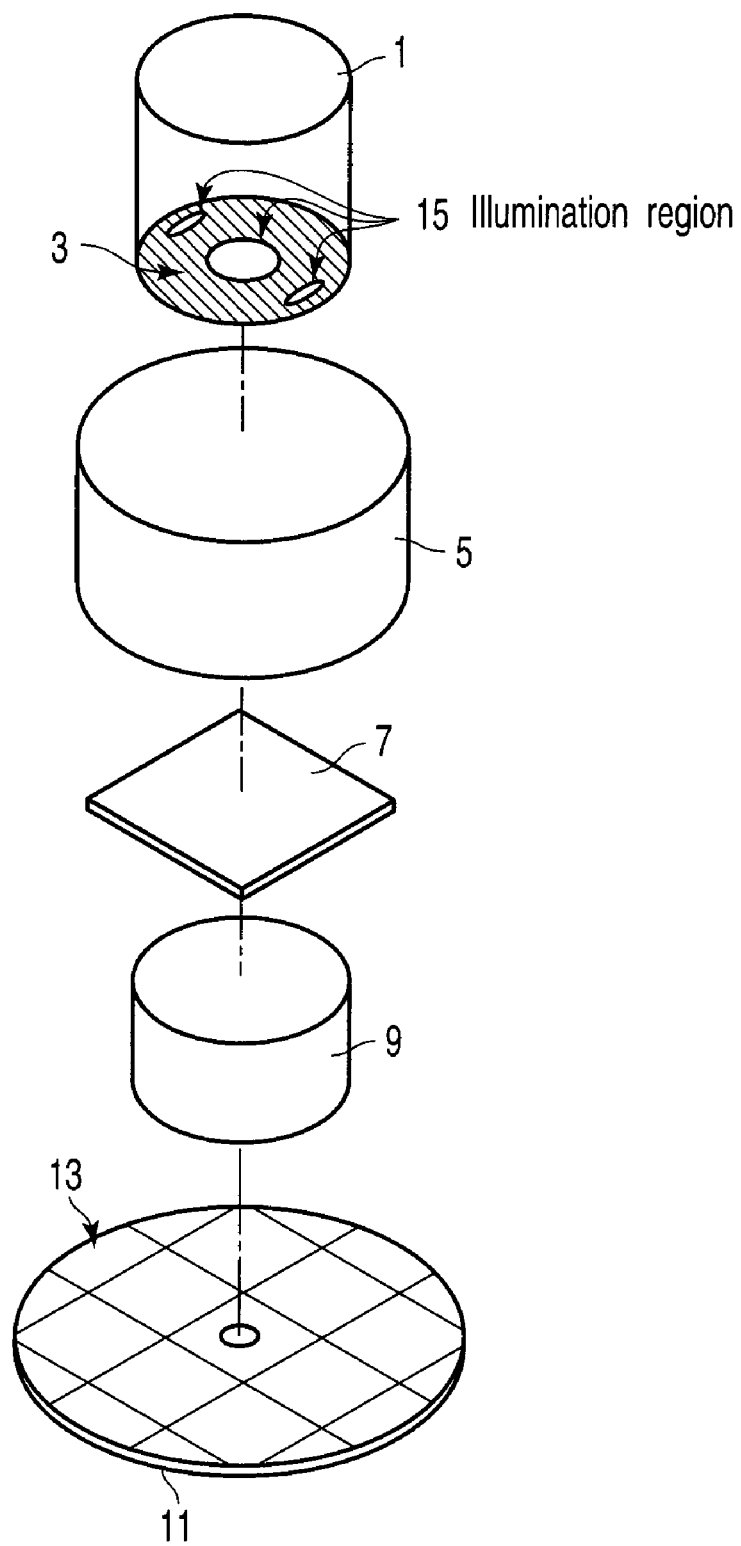
FIG. 1 is an outline diagram of an exposure device.

Embodiments of the present invention will be described below with reference to the accompanying drawings. Throughout the drawings, the same or similar components are identified with the same or similar reference numerals.

First Embodiment

The exposure process in manufacturing a semiconductor device is a process for transferring a pattern written on a photomask to a photoresist film formed on a semiconductor substrate. Since the basic function of the exposure process is to transfer a pattern written on a photomask to a film, it is ideal that the output (the size of the pattern transferred on the photoresist film) and the input (the size of the pattern written on the photomask) should be equal to each other as specified in formula (1).

$$\text{Output}=\text{input} \tag{1}$$

That is, ideally, the following relation of formula (2) should be established between the pattern written on the photomask and the pattern transferred on the photoresist film.

$$R\text{resist}=R\text{photo} \tag{2}$$

where $R$resist is the size of the pattern transferred on the photoresist film, and $R$photo is the size of the pattern written on the photomask.

In the exposure process, however, for the purpose of correcting optical proximity effect (OPE) or assuring an exposure margin, generally, the size to be written on the photomask is intentionally deviated from the desired size to be transferred on the photoresist film (this is called biasing), or an error is preliminarily included in the size to be written on the photomask. Thus, the relation between the pattern written on the photomask and the pattern transferred on the photoresist is generally expressed by following formula (3), rather than by formula (2).

$$R\text{resist}=\beta(R\text{photo}+\alpha) \tag{3}$$

where $\alpha$ is a margin or OPE correction amount (generally, bias amount), and $\beta$ is an error coefficient.

In both the formulas (2) and (3), the optical coefficient and reduction rate are omitted, and the formulas (2) and (3) are ultimately simplified expressions of the relation between $R$resist and $R$photo.

The error coefficient $\beta$ involves various error factors. Reducing the error factors so that the error coefficient $\beta$ is as close to "1" as possible will lead to enhancement of the quality of the exposure process. This results in contribution to improvement in function of the semiconductor device and improvement in production yield of the semiconductor device.

The designing technique as described in which the robustness of the input and output relation is introduced in the designing to reduce the error factors to thereby achieve the ideal input and output relation, that is, output=input, is called robust designing.

As the semiconductor device is becoming finer, the transfer of a pattern on a photoresist film at high precision is becoming more difficult. To minimize the reduction of the precision, for example, it is attempted to insert an illumination aperture at a position off the center of the optical axis, which is known as deformed illumination.

When a deformed illumination is designed, for example, the optical beam source is divided into small grids, each of which is assumed to be a unit optical beam source (or spot optical beam source). By using indices such as the contrast of the intensity of the image formed by the unit optical beam sources, or NILS (normalized image log-slope), an optimum illumination shape is obtained.

The indices such as contrast of image intensity and NILS are useful for judging how much the spot optical beam sources are effective for forming a pattern, however, the computation thereof is difficult.

Furthermore, these indices have nothing to do with the error of illumination aperture of the exposure device. It is hence difficult to reduce the error caused by illumination aperture error by using these indices. Therefore, these indices do not contribute to enhancement of robustness against illumination aperture error of the exposure device.

According to the present embodiment, a method of evaluating an optical beam source of an exposure device is disclosed, in which a robust illumination shape is designed against the illumination aperture error. An outline of the exposure device, which is shown in FIG. 1, will now be described.

The exposure device shown in FIG. 1 includes an exposure optical beam source 1, an illumination aperture 3, a condenser lens 5, a photomask 7, and a projection lens 9. The optical beam emitted from the optical beam source 1 enters the condenser lens 5 by way of the illumination aperture 3. The optical beam having passed through the condenser lens 5 enters the photomask 7. The optical beam having passed through the photomask 7 enters a photoresist film 13 on a semiconductor substrate (semiconductor wafer) 11 by way of the projection lens 9, so that an image written on the photomask 7 is focused on the photoresist film 13.

In this embodiment, the optical beam source 1 of the exposure device is ArF excimer laser of NA=0.85, σ=0.95, and it is intended to obtain an optimum illumination shape when a line-and-space pattern (LS pattern) of 70 nm is exposed as a target pattern. The illumination shape specified herein is a shape of an illumination region 15 formed on the illumination aperture 3 shown in FIG. 1. In the illumination aperture 3 of the exposure device shown in FIG. 1, the illumination region 15 is formed also at a position off the center of the optical axis. This kind of exposure device is called a deformed illumination type exposure device. The present embodiment is applied not only to the deformed illumination type exposure device, but also to an ordinary exposure device forming the illumination region in the center of the optical axis.

Figure 2:
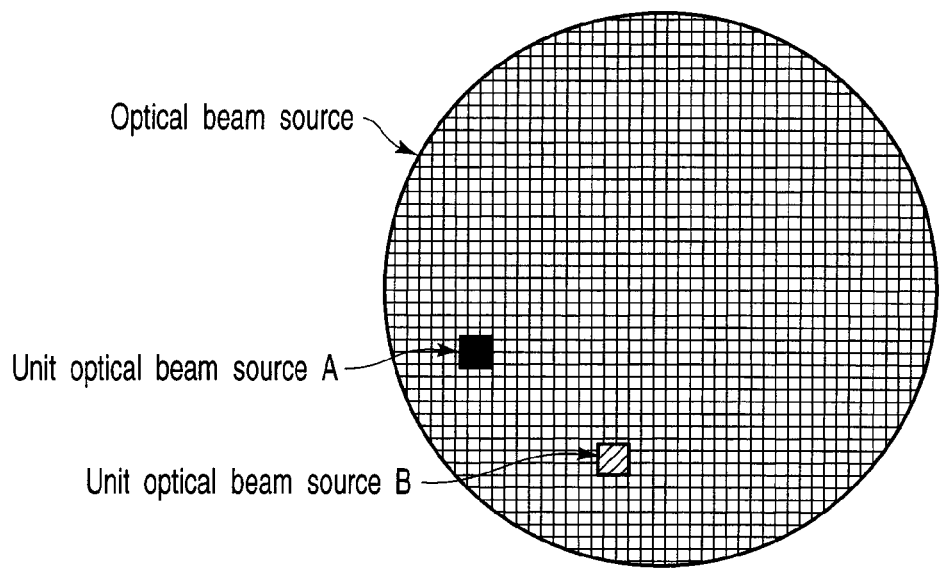
FIG. 2 is a diagram showing an optical beam source divided into unit optical beam sources according to a first embodiment of the present invention.

The optical beam source evaluation method will be specifically described below. FIG. 2 shows the exposure optical beam source 1 in the exposure device in FIG. 1, and the exposure optical beam source 1 is an optical beam source divided into a plurality of unit optical beam sources.

As shown in FIG. 2, in this embodiment, the exposure optical beam source 1 is divided into a plurality of unit optical beam sources in a unit size determined by the exposure device. In this embodiment, in order to enhance the robustness against the illumination aperture error, the difference in evaluation amounts based on the presence and absence of each of the unit optical beam sources is introduced. For example, a targeted unit optical beam source is turned on (i.e., presence of a unit optical beam source), and an evaluation amount at the turned on state of the targeted beam source is acquired. Subsequently, the targeted unit optical beam source is turned off (i.e., absence of a unit optical beam source), and an evaluation amount at the turned off state of the targeted beam source is acquired. Then, the difference between the evaluation amount at the turned on state of the targeted beam source and the evaluation amount at the turned off state of the targeted beam source is acquired. In this embodiment, the image intensity is used as the evaluation amount, and the degree of change in image intensity is obtained. The degree of change of the evaluation amounts between the turned on state and the turned off state of the targeted beam source is used as the criterion (index of evaluation of optical beam source), and the unit optical beam source is evaluated.

Specifically, if the change of the evaluation amounts between the turned on state and the turned off state of the targeted beam source is large, the influence of the presence or absence of this optical beam unit on the optical image is judged to be large, and this unit optical beam source is not selected as the optical beam source, or this unit optical beam source is moved away from the edge of the illumination region.

Figure 3A:
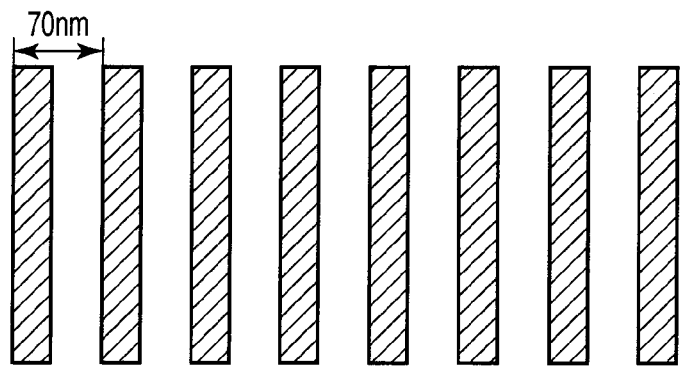
FIG. 3A is a diagram showing an example of a target pattern.

As shown in FIG. 3A, the target pattern in this embodiment is an LS pattern. The image intensity of the LS pattern is shown in FIG. 3B.

Figure 3B:
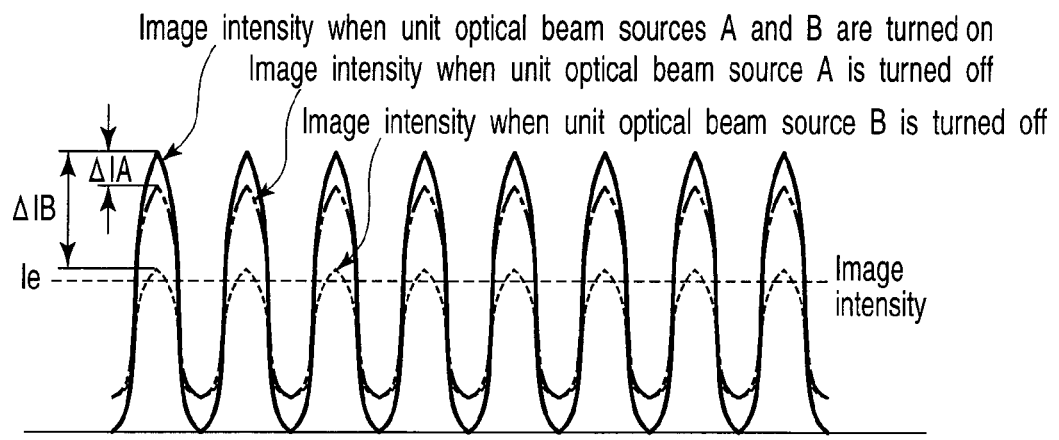
FIG. 3B is a diagram showing changes in image intensity when unit optical beam sources A, B shown in FIG. 2 are turned on and turned off.

As shown in, for example, FIG. 3B, the image intensity of the LS pattern when the unit optical beam source A shown in FIG. 2 is turned on differs from that when the unit optical beam source A is turned off. Similarly, the image intensity of the LS pattern when the unit optical beam source B is turned on differs from that when the unit optical beam source B is turned off. Then, a difference $\Delta IA$ between an image intensity when the unit optical beam source A is turned on and an image intensity when it is turned off, and a difference $\Delta IB$ between an image intensity when the unit optical beam source B is turned on and an image intensity when it is turned off are acquired. These image intensities can be obtained by, for example, a lithography simulation.

In this example, as shown in FIG. 3B, the difference $\Delta IA$ is small, and the difference $\Delta IB$ is large. Hence, the effect of presence or absence of the unit optical beam source A on the optical image is considered to be small. To the contrary, the effect of presence or absence of the unit optical beam source B on the optical image is considered to be large. On the basis of this result of evaluation, in this example, the unit optical beam source A is selected as the optical beam source because the effect thereof on the optical image is small. To the contrary, the unit optical beam source B is not selected as the optical beam source because the effect thereof on the optical image is large, or it is moved away from the edge of the illumination region.

In this way, according to the present embodiment, since the exposure optical beam source is evaluated on the basis of the degree of the difference of the evaluation amounts between the presence and absence of the unit optical beam source, the exposure optical beam source can be evaluated in consideration of the influence exhibited when the unit optical beam source is not formed exactly as designed, for example, in consideration of a design error of the illumination aperture. As a result, the errors due to design error of the illumination aperture can be reduced, which contributes to enhancement of robustness against design error of the illumination aperture of the exposure device.

In this embodiment, the evaluation amount is based on the image intensity, however, other than the image intensity, it may be also evaluated on the basis of the resist size, margin, or contrast. For example, in a case where the evaluation amount is based on the resist size, when the difference between the size of the photoresist film pattern when the unit optical beam source is turned on and the size of the photoresist film pattern when the unit optical beam source is turned off, is large and over an allowable value, the specific unit optical beam source is not employed for illumination.

Similarly, in a case where the evaluation amount is based on the margin, when the difference between the margin when the unit optical beam source is turned on and the margin when the unit optical beam source is turned off, is large and over an allowable value, the specific unit optical beam source is not employed for illumination. Herein, the margin may include an exposure margin and an exposure latitude, and the like. The exposure margin is a ratio of an optimum exposure amount Es to a minimum exposure amount Eo, that is, Es/Eo. The exposure latitude is a range of an exposure energy in which a size of the photoresist film pattern settles within limits.

In a case where the evaluation amount is based on the contrast, when the difference between the contrast when the unit optical beam source is turned on and the contrast when the unit optical beam source is turned off, is large and over an allowable value, the specific unit optical beam source is not employed for illumination.

These values of resist size, margin and contrast can be also obtained via a lithography simulation as is the case with the image intensity.

In this embodiment, the target pattern is the LS pattern, however it is not particularly limited thereto, and may include, for example, isolated line pattern and hole pattern.

A difference map over the entire region usable for illumination of the exposure optical beam source 1 is obtained by acquiring the difference as above described such as the difference of an image intensity, the difference of a resist size, the difference of a margin, or the difference of a contrast, for each of the unit optical beam sources in the entire region usable for illumination of the exposure optical beam source 1, such as the difference of image intensity, the difference of resist size, the difference of margin, or the difference of contrast, and plotting the obtained differences on the positions corresponding to the unit optical beam sources on the entire region usable for illumination of the exposure optical beam source 1. Examples of mapping will be explained below. FIGS. 4A to 4D are diagrams schematically showing the state of acquiring the differences. In FIGS. 4A to 4D, for the ease of understanding, the state of acquiring the resist size as an example of the difference is shown in a visible state. Actually, the resist size is obtained via a lithography simulation, not by repeating exposures as shown in FIGS. 4A to 4D.

First, as shown in FIG. 4A, all of the unit optical beam sources are turned on, and the resist size of a target pattern is obtained. In this embodiment, the target pattern is an LS pattern, however, it is not limited to the LS pattern as mentioned above.

Next, as shown in FIG. 4B, one unit optical beam source is turned off, and the resist size of the target pattern is obtained. Then, the difference (size variation) $\Delta CD$ between the resist size obtained in FIG. 4A and the resist size obtained in FIG. 4B is acquired. The acquired difference is plotted at a position corresponding to the turned off unit optical beam source on the region usable for illumination of the exposure optical beam source 1.

As shown in FIG. 4C, one unit optical beam source other than the unit optical beam source shown in FIG. 4B is turned off, and the resist size of the target pattern is obtained. Then, the difference (size variation) $\Delta CD$ between the resist size obtained in FIG. 4A and the resist size obtained in FIG. 4C is acquired. The acquired difference is plotted at a position corresponding to the turned off unit optical beam source on the region usable for illumination of the exposure optical beam source 1.

As shown in FIG. 4D, a further unit optical beam source other than the unit optical beam source shown in FIG. 4C is turned off, and the same operation as in FIGS. 4B and 4C is repeated. The above operation is repeated for all of the unit optical beam sources in the entire region usable for illumination of the exposure optical beam source 1, so that, as shown in FIG. 5, a difference map over the entire region usable for illumination of the exposure optical beam source 1 is obtained. The difference map in this embodiment is a resist size variation distribution map (sensitivity distribution map) on the basis of the degree of the difference of the evaluation amounts between the presence and absence of unit optical beam sources.

Thus, by obtaining the difference map over the entire region usable for illumination of the exposure optical beam source 1, the magnitude of variation amount of the target pattern can be visibly recognized. By overlapping the magnitude of variation amount on the illumination shape suited to the target pattern, a more appropriate illumination shape may be designed. FIG. 6 shows an example of an illumination shape designed on the basis of the resist size variation distribution map shown in FIG. 5. The illumination shape shown in FIG. 6 is an illumination shape necessary for exposure of an LS pattern obtained by employing, for illumination, portions of the map in which the differences $\Delta CD$ of the unit optical beam sources are small and within an allowable value.

Second Embodiment

Figure 7:
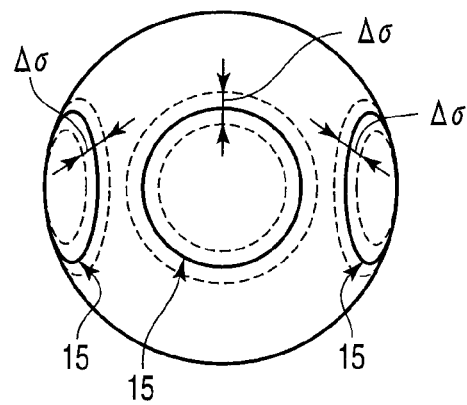
FIG. 7 is a diagram showing a method of designing illumination shape of an exposure device according to a second embodiment of the present invention.

FIG. 7 is a diagram showing a method of designing an illumination shape of an exposure device according to a second embodiment of the present invention. The illumination shape necessary for forming the target pattern, for example, an LS pattern, is roughly determined based on the optical condition, as shown in FIG. 7. When a processing error of $\Delta\sigma$ is assumed with respect to this illumination shape, the unit optical beam sources existing in the region included in this error $\Delta\sigma$ are turned on and turned off, and the variation amount in the region included in the error $\Delta\sigma$ is evaluated.

Figure 8:
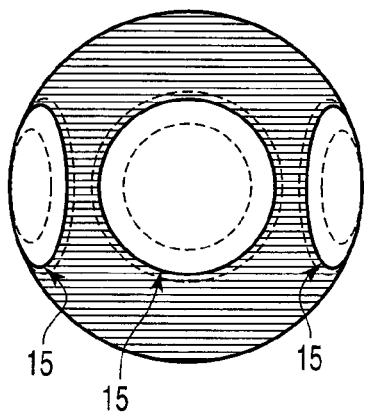
FIG. 8 is a diagram showing an example of the illumination shape according to the second embodiment of the present invention, in which the illumination region is magnified.

If the variation amount in the region included in the error $\Delta\sigma$, for example, the difference $\Delta CD$ of the resist size, is small and within an allowable value, the illumination region 15 is magnified as shown in FIG. 8.

Figure 9:
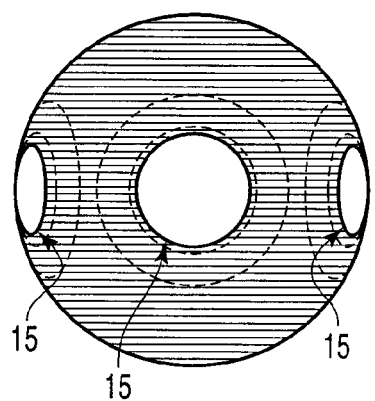
FIG. 9 is a diagram showing an example of the illumination shape according to the second embodiment of the present invention, in which the illumination region is reduced.

Alternatively, if the difference $\Delta CD$ exceeds the allowable value, the illumination region 15 is reduced as shown in FIG. 9, or the portion exceeding the allowable value of the difference $\Delta CD$ is moved away from the edge of the illumination region 15.

Figure 10:
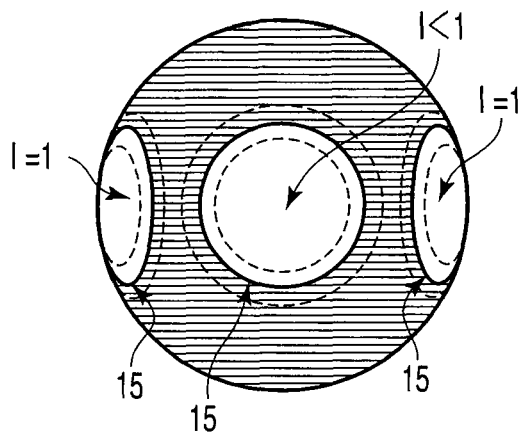
FIG. 10 is a diagram showing an example of the illumination shape according to the second embodiment of the present invention, in which the illumination region is adjusted.

If the portion exceeding the allowable value of the difference $\Delta CD$ cannot be moved away from the edge of the illumination region 15, as shown in FIG. 10, the illumination intensity I of the illumination region 15 is adjusted to "I<1", and the influence of $\Delta\sigma$ is suppressed.

Thus, by turning on and off the unit optical beam sources in the region included in the processing error $\Delta\sigma$, the variation amount based on the presence or absence of the unit optical beam sources in the region included in the processing error $\Delta\sigma$ can be evaluated, and a robust illumination shape against the error of the illumination aperture can be designed.

Since the illumination shape designed by the designing method of this embodiment has the error of the illumination aperture taken into consideration, the production yield of the semiconductor devices can be enhanced by using the exposure device designed on the basis of this illumination.

Third Embodiment

A third embodiment relates to a software for optimizing a illumination shape of an exposure device.

The method of evaluating an optical beam source of an exposure device explained in the second embodiment may be used as a software for optimizing an illumination shape of the exposure device by being stored in a computer-readable recording medium. Examples of the computer-readable recording medium include magnetic disk, optical disk, and nonvolatile semiconductor memory.

Figure 11:
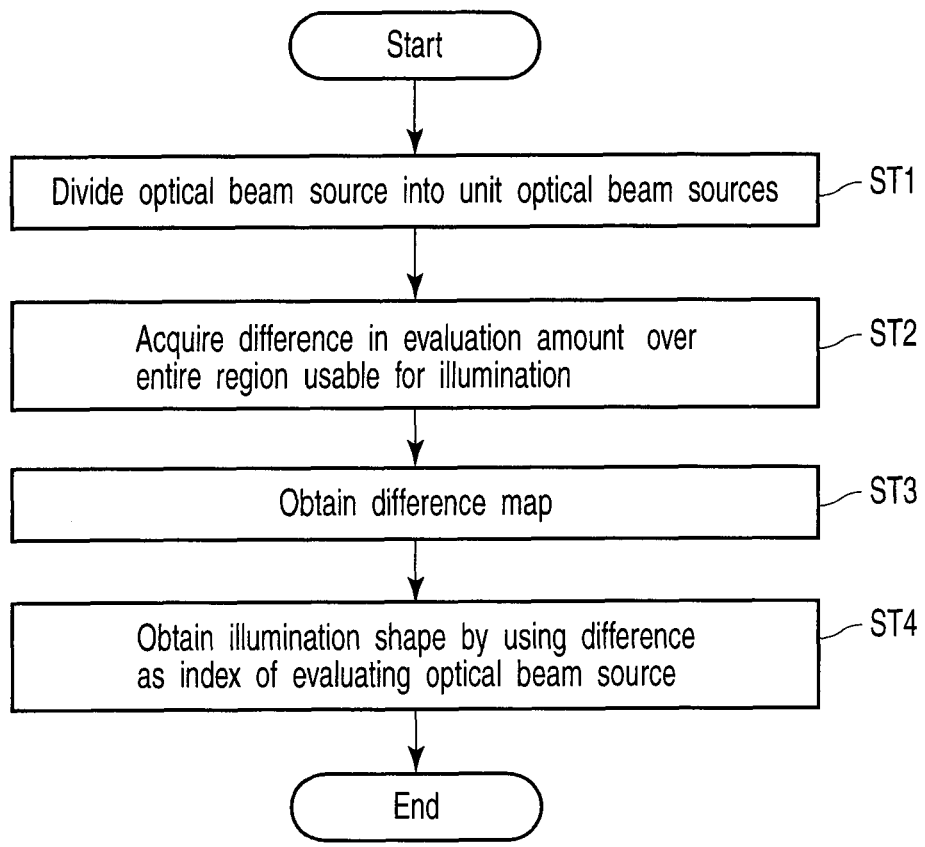
FIG. 11 is a flow chart showing an example of a basic procedure of a software of optimizing illumination shape of an exposure device according to a third embodiment of the present invention.

FIG. 11 is a flow chart showing an example of a basic procedure of the software for optimizing an illumination shape of an exposure device according to the third embodiment of the present invention.

At ST1 in FIG. 11, the exposure optical beam source is divided into a plurality of unit optical beam sources in a unit size determined on the basis of the exposure device.

At ST2, the difference between the evaluation amount of a target pattern on the semiconductor substrate when the unit optical beam source is turned on, and the evaluation amount of the target pattern on the semiconductor substrate when the unit optical beam source is turned off is acquired in each of the unit optical beam sources in the entire region used for illumination of the exposure optical beam source.

At ST3, the difference obtained in each of the unit optical beam sources is plotted on a position corresponding to the unit optical beam source on the region used for illumination of the exposure optical beam source 1 to form a difference map. Next, at ST4, the illumination shape is obtained by using the difference as an index of evaluating the optical beam source.

By storing such procedure in a computer-readable recording medium, a software for optimizing an illumination shape of an exposure device is obtained.

Figure 12:
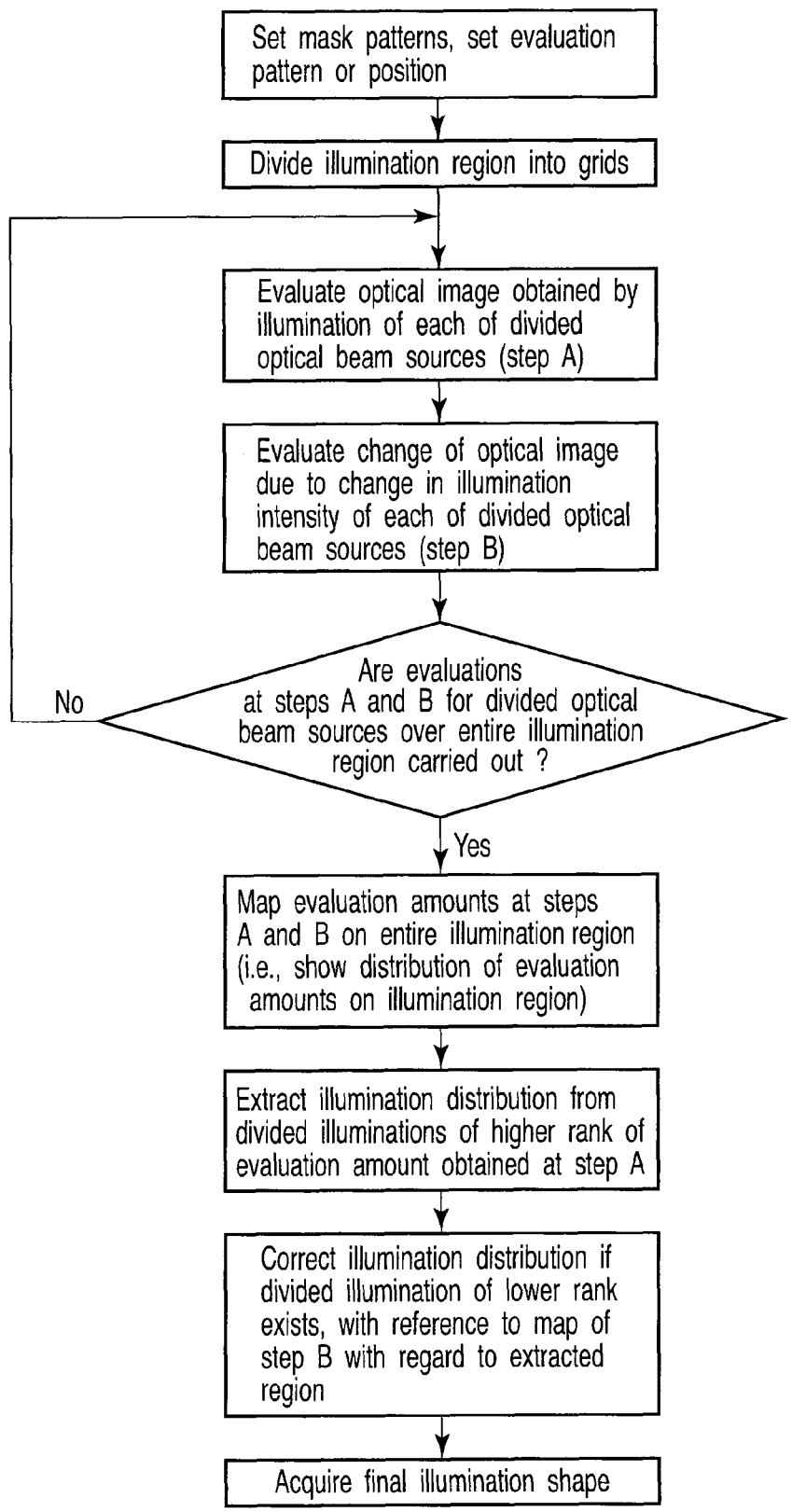
FIG. 12 is a flow chart showing an example of a specific procedure of the software of optimizing illumination shape of an exposure device according to the third embodiment of the present invention.

FIG. 12 is a flow chart showing an example of a specific procedure of the software for optimizing an illumination shape of an exposure device according to the third embodiment of the present invention.

As shown in FIG. 12, first, a mask pattern to be written on the photomask is set, and an evaluation pattern (or an evaluation position) is determined from the mask patterns.

Next, the illumination region is divided into grids.

The optical image formed by illumination from the divided optical beam sources is evaluated (step A). Step A is intended to hold the imaging characteristics of the optical beam source, and, for example, the method of designing an illumination optical beam source disclosed in FIG. 24 of Jpn. Pat. Appln. KOKAI Publication No. 2006-66440 may be utilized.

Further, a change of the optical image due to a change of illumination intensity of the divided optical beam sources is evaluated (step B). Step B is intended to make robust the imaging of the optical beam source, and, for example, the procedure shown in FIG. 11 may be utilized.

Next, it is judged whether or not the evaluation at step A and the evaluation at step B have been completed over the entire region usable for illumination. If the evaluations are not completed (No), the evaluation at step A and evaluation at step B are repeated. When the evaluations are completed over the entire region usable for illumination (Yes), the evaluation amounts at step A and the evaluation amounts at step B are mapped in the entire illumination region. This mapping is achieved by, for example, plotting each of the evaluation amounts on the corresponding portion of the illumination region.

An illumination distribution is then extracted from the divided illuminations of higher rank of evaluation amount at step A. In the extracted region, by referring to the evaluation amount map of step B, if a divided illumination of lower rank is found, the illumination distribution is corrected to attain a final illumination shape.

Also by storing such procedure in a computer-readable recording medium, a software for optimizing an illumination shape of an exposure device is obtained.

Figure 13:
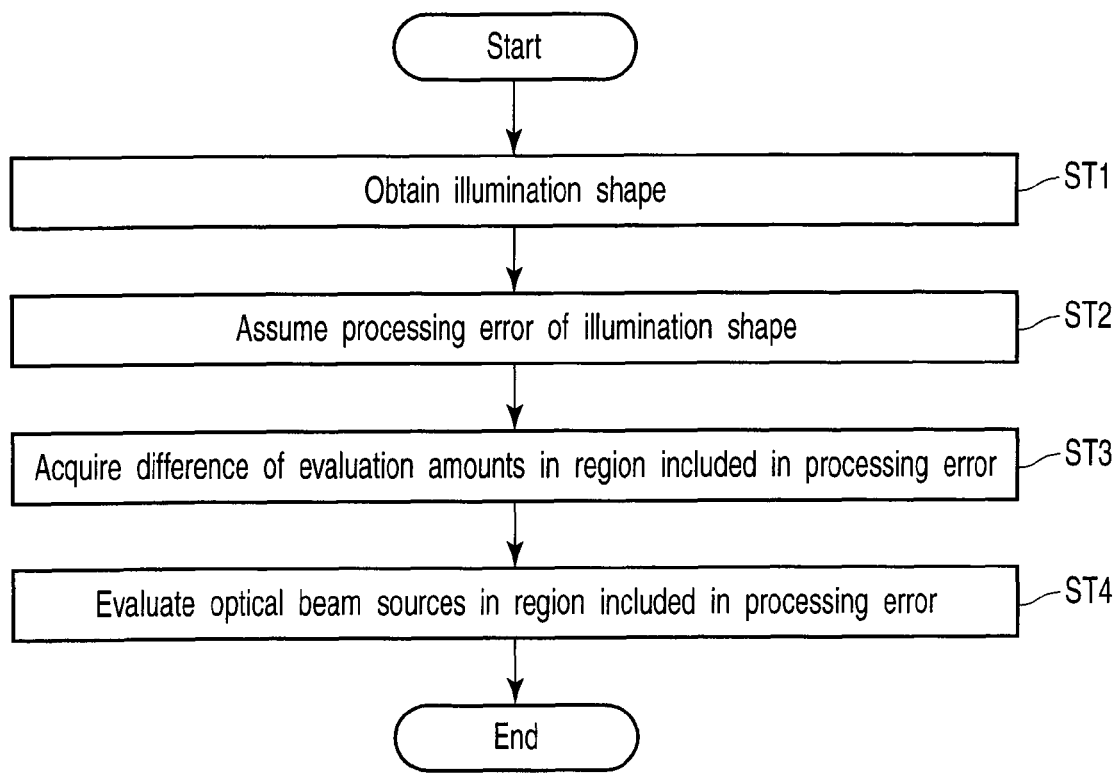
FIG. 13 is a flow chart showing an example of a procedure of the software of optimizing illumination shape of an exposure device according to the third embodiment of the present invention.

Further, the procedure shown in FIG. 13 may be stored in a computer-readable recording medium. At ST1 in FIG. 13, an illumination shape is obtained. This illumination shape may be obtained, for example, in the same procedure as that shown in FIG. 11 or FIG. 12.

At ST2, a processing error of the illumination shape of the exposure device is assumed. The processing error is, for example, Δσ as explained in the second embodiment.

At ST3, a difference between an evaluation amount of a target pattern on the semiconductor substrate when the unit optical beam source existing in the region included in the processing error is turned on, and an evaluation amount of the target pattern on the semiconductor substrate when the unit optical beam source existing in the region included in the processing error is turned off is obtained.

At ST4, the optical beam source of the region included in the processing error is evaluated.

Figure 14:
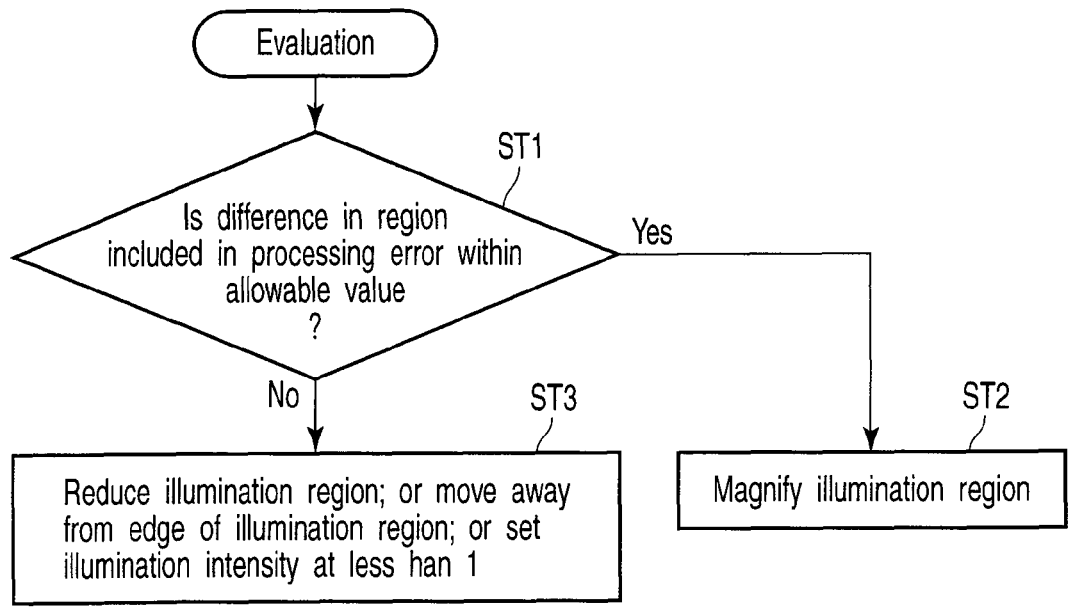
FIG. 14 is a flow chart showing an example of evaluation of an optical beam source.

The optical beam source may be evaluated, for example, in the procedure shown in FIG. 14. That is, first, at ST1 in FIG. 14, it is judged whether the difference in the region included in the processing error is within an allowable value or not.

When the difference is within the allowable value (Yes), the size of the illumination region is magnified.

To the contrary, when the difference exceeds the allowable value (No), the size of the illumination region is reduced. Alternatively, the portion exceeding the allowable value is moved away from the edge of the illumination region. Alternatively, if the portion exceeding the allowable value overlaps with the edge of the illumination region, the illumination intensity of the illumination region is set at less than 1.

The advantage of such software is that the variation amount can be evaluated on the basis of the presence or absence of the unit optical beam sources in the region included in the processing error, by turning on or off the unit optical beam sources in the region included in the processing error, and a robust illumination shape can be designed against the illumination aperture error.

Figure 15:
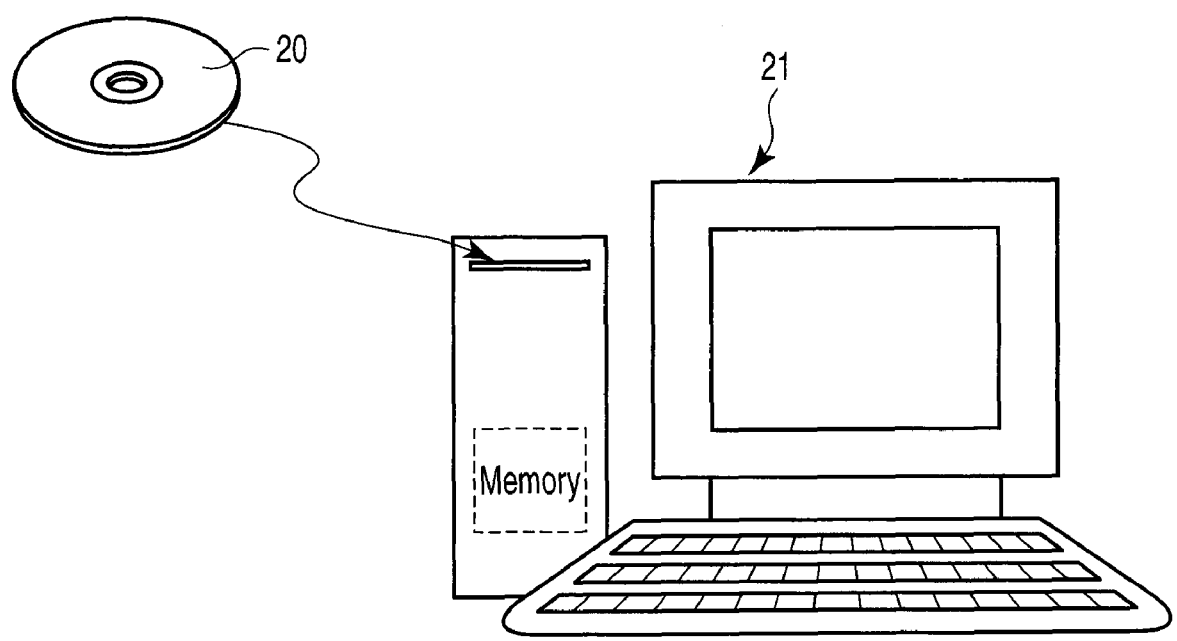
FIG. 15 is a diagram showing an example of a lithography simulator using the software of optimizing illumination shape of an exposure device according to the third embodiment of the present invention.

The software according to the third embodiment is stored in a recording medium 20 as shown in FIG. 15, and is downloaded, as required, in a memory of, for example, a lithography simulator. The lithography simulator having stored therein the software according to the third embodiment may be utilized not only in a lithography simulation, but also in design of an illumination shape of an exposure device, such as shape of an illumination aperture.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A method of evaluating an optical beam source of an exposure device used in an exposure process in manufacturing a semiconductor device, the method comprising:
    dividing the optical beam source into a plurality of unit optical beam sources in a unit size determined by the exposure device;
    turning on and off, each one time, the plurality of unit optical beam sources, one by one, in an optical beam source region usable for illumination of the optical beam source;
    acquiring a difference between a first evaluation of a target pattern determined when one of the plurality of unit optical beam sources is turned on and a second evaluation of the target pattern determined when the one of the plurality of unit optical beam sources is turned off; and
    plotting the difference for each of the plurality of unit optical beam sources on a position corresponding to each of the plurality of unit optical beam sources to form a difference map.

2. The method of evaluating an optical beam source of an exposure device according to claim 1, wherein at least one of an intensity of an image of the target pattern, a size of a resist pattern of the image, a margin of the resist pattern, and a contrast of the image is used as the first evaluation or the second evaluation.

3. The method of evaluating an optical beam source of an exposure device according to claim 1, wherein a portion of the optical beam source region in which the differences acquired for the unit optical beam sources are within an allowable value is selected by referring to the difference map to form an illumination shape of the exposure device.

4. The method of evaluating an optical beam source of an exposure device according to claim 1, further comprising:
    estimating a processing error of an illumination shape of the exposure device;
    acquiring a difference between an evaluation of the target pattern on the semiconductor substrate when a unit optical beam source which is within a region included in the processing error is turned on and an evaluation of the target pattern on the semiconductor substrate when the unit optical beam source is turned off; and
    evaluating an optical beam source in the region included in the processing error by using the acquired difference as an index.

5. The method of evaluating an optical beam source of an exposure device according to claim 4, wherein a size of the illumination shape is increased when the difference in the region included in the processing error is within an allowable value.

6. The method of evaluating an optical beam source of an exposure device according to claim 4, wherein a size of the illumination shape is decreased when the difference in the region included in the processing error exceeds an allowable value.

7. The method of evaluating an optical beam source of an exposure device according to claim 4, wherein when the difference in the region included in the processing error exceeds an allowable value, a portion exceeding the allowable value is moved away from an edge of an illumination region of the illumination shape.

8. The method of evaluating an optical beam source of an exposure device according to claim 4, wherein an illumination intensity of an illumination region of the illumination shape is reduced when the difference in the region included in the processing error exceeds an allowable value and a portion exceeding the allowable value overlaps with an edge of the illumination region of the illumination shape.

9. The method of evaluating an optical beam source of an exposure device according to claim 1, wherein the exposure device is a deformed illumination type exposure device in which an illumination region is at a position off a center of an optical axis.

10. The method of evaluating an optical beam source of an exposure device according to claim 1, wherein the target pattern includes one of a line-and-space pattern, an isolated line pattern and a hole pattern.

11. A method of designing an illumination shape of an exposure device used in an exposure process in manufacturing a semiconductor device, the method comprising:
dividing an optical beam source into a plurality of unit optical beam sources in a unit size determined by the exposure device, wherein a subset of the plurality of unit optical beam sources are in a region usable for illumination;
for each unit optical beam source of the subset of the plurality of unit optical beam sources:
turning on and off, each one time, the plurality of unit optical beam sources, one by one, in an optical beam source region usable for illumination of the optical beam source;
acquiring a difference between a first evaluation of a target pattern determined when one of the plurality of unit optical beam sources is turned on and a second evaluation of the target pattern determined when the one of the plurality of unit optical beam sources is turned off;
plotting the difference for each of the plurality of unit optical beam sources on a position corresponding to each of the plurality of unit optical beam sources to form a difference map; and
selecting portions of the difference map in which the plotted differences are within an allowable value to form an illumination shape of the exposure device corresponding to the selected portions.

12. The method of designing an illumination shape of an exposure device according to claim 11, wherein at least one of an intensity of an image of the target pattern, a size of a resist pattern of the image, a margin of the resist pattern, and a contrast of the image is used as the first evaluation or the second evaluation.

13. The method of designing an illumination shape of an exposure device according to claim 11, further comprising:
estimating a processing error of an illumination shape of the exposure device;
acquiring a difference between an evaluation of the target pattern on the semiconductor substrate when a unit optical beam source which is within a region included in the processing error is turned on and an evaluation of the target pattern on the semiconductor substrate when the unit optical beam source is turned off; and
evaluating an optical beam source in the region included in the processing error by using the acquired difference as an index.

14. The method of designing an illumination shape of an exposure device according to claim 13, wherein a size of the illumination shape is increased when the difference in the region included in the processing error is within the allowable value.

15. The method of designing an illumination shape of an exposure device according to claim 13, wherein a size of the illumination shape is decreased when the difference in the region included in the processing error exceeds the allowable value.

16. The method of designing an illumination shape of an exposure device according to claim 13, wherein when the difference in the region included in the processing error exceeds the allowable value, a portion exceeding the allowable value is moved away from an edge of an illumination region of the illumination shape.

17. The method of designing an illumination shape of an exposure device according to claim 13, wherein an illumination intensity of an illumination region of the illumination shape is reduced when the difference in the region included in the processing error exceeds the allowable value and a portion exceeding the allowable value overlaps with an edge of the illumination region of the illumination shape.

18. The method of designing an illumination shape of an exposure device according to claim 11, wherein the exposure device is a deformed illumination type exposure device in which an illumination region is at a position off a center of an optical axis.

19. A software for optimizing illumination shape of an exposure device used in an exposure process in manufacturing a semiconductor device and provided with a non-transitory computer-readable recording medium, the software comprising instructions for:
a procedure of dividing an optical beam source into a plurality of unit optical beam sources in a unit size determined by the exposure device, wherein a subset of the plurality of unit optical beam sources are in a region usable for illumination;
for each unit optical beam source of the subset of the plurality of unit optical beam sources:
a procedure for turning on and off, each one time, the plurality of unit optical beam sources, one by one, in an optical beam source region usable for illumination of the optical beam source;
a procedure of acquiring a difference between a first evaluation of a target pattern determined when one of the plurality of unit optical beam sources is turned on and a second evaluation of the target pattern determined when the one of the plurality of unit optical beam sources is turned off;
a procedure of plotting the difference for each of the plurality of unit optical beam sources on a position corresponding to each of the plurality of unit optical beam sources to form a difference map; and
a procedure of selecting portions of the difference map in which the plotted differences are within an allowable value to form an illumination shape of the exposure device corresponding to the selected portions.

* * * * *